United States Patent [19]

Worrell et al.

[11] Patent Number: 5,648,733

[45] Date of Patent: Jul. 15, 1997

[54] SCAN COMPATIBLE 3-STATE BUS CONTROL

[75] Inventors: Frank Worrell, San Jose; Darren Jones, Mountain View, both of Calif.

[73] Assignee: LSI Logic Corporation, Milpitas, Calif.

[21] Appl. No.: 548,369

[22] Filed: Nov. 1, 1995

[51] Int. Cl.[6] .............................. H03K 19/0175
[52] U.S. Cl. .......................... 326/86; 326/16; 326/56
[58] Field of Search ................................ 326/86, 93, 96, 326/97, 56, 57, 58, 26, 27, 28, 16

[56] References Cited

U.S. PATENT DOCUMENTS

| | | | |
|---|---|---|---|
| 4,587,445 | 5/1986 | Kanuma | 326/86 |
| 4,800,486 | 1/1989 | Horst et al. | 395/375 |
| 4,857,773 | 8/1989 | Takata et al. | 326/57 |
| 5,118,970 | 6/1992 | Olson et al. | 326/86 |
| 5,394,034 | 2/1995 | Becker et al. | 326/82 |

FOREIGN PATENT DOCUMENTS

| | | | |
|---|---|---|---|
| 1-260949 | 10/1989 | Japan | 326/86 |
| 3-272219 | 12/1991 | Japan | 326/86 |

OTHER PUBLICATIONS

Wakerly, John F.; "Digital Design: Principles and Practices"; copyright 1989 by John F. Wakerly; p. 274.

Primary Examiner—Edward P. Westin
Assistant Examiner—Benjamin D. Driscoll
Attorney, Agent, or Firm—Townsend and Townsend and Crew LLP

[57] ABSTRACT

Bus control circuitry for enabling/disabling the drivers of a bus in an integrated circuit is presented. The bus control circuitry has master control signal logic blocks and output enable blocks. The bus control circuitry enables one and only one bus driver set at a time to avoid bus contention. Furthermore, the bus driver circuits are enabled and disabled with precise timing to avoid even momentary bus contention. Finally, the bus, driver circuits and control circuitry may be tested with serial scanning.

6 Claims, 3 Drawing Sheets

SCAN COMPATIBLE 3-STATE BUS CONTROL

BACKGROUND OF THE INVENTION

The present invention is related to the field of bus design for integrated circuits and, more particularly, to the design of scan compatible bus control circuitry.

A bus is a plurality of signal lines which moves several bits in parallel from one location to another in an integrated circuit. Data buses in present day microprocessors, for example, are typically 16 or 32 bits wide. That is, the bus has 16 or 32 signal lines which carry 16 or 32 data bits at time in parallel. To place the bits on the bus, each signal line has one or more driver circuits which can pull the voltage on the signal line high for a logic 1, or low for a logic 0. Often, more than one driver circuit is attached to a bus signal line so that different functional units on an integrated circuit may use the same bus. Of course, one and only one driver should drive a bus signal line at any one time. Besides the problem of the determining the logic level of the bus signal, two or more simultaneously active drivers cause excessive currents when the data of the two drivers differ, i.e., one driver is at the logic 1 state and the other driver is at the logic 0 state. Thus the drivers of a bus are operated so that only one set of drivers is enabled at a time; the other sets of drivers are disabled.

It is desirable that the elements of an integrated circuit be tested to check their functional operation. For a bus, it is desirable to check the bus itself, the bus drivers, and the control circuitry of the bus drivers. In testing an electronic system, including integrated circuits, test bits which are scanned into the system provide an efficient testing method. The test bits are typically created by an automatic test pattern generator. A problem in testing the bus, its drivers and control circuitry with the test bits of an automatic test pattern generator is the "one, and only one" driver condition. Two or more simultaneously active drivers cause excessive currents when the data of the two drivers differ, i.e., one driver is at the logic 1 state and the other driver is at the logic 0 state. On the other hand, if there are no active drivers, this allows the bus to float which may also cause excessive current. Heretofore, previous designs have not adequately handled the combination of scanning and the three-state control of a bus and its drivers.

On the other hand, the present invention solves or substantially mitigates this problem. Furthermore, the present invention allows for the control of the bus and its drivers with precise timing to avoid undesirable bus contention at high speed.

SUMMARY OF THE INVENTION

To accomplish these ends, the present invention provides for bus driver control circuitry for an integrated circuit device having a bus with each driver circuit having a control terminal for enabling and disabling the driver circuit responsive to signals at its control terminal. The control circuitry for each driver circuit has a plurality of master control signal logic blocks. Each block has a first input terminal receiving a scan signal, a second input terminal receiving a control signal from functional units of the integrated circuit, a first output terminal connected in a serial scan chain and a second output terminal. The control signal logic block selectively passes the scan signal or the control signal to the second output terminal responsive to a scan control signal, and selectively passes the signal at the second output terminal to the first output terminal at a transition of the clock signal or holds a signal at the second output terminal responsive to a stall control signal.

The bus control circuitry also has an output enable logic block for each driver circuit. The output enable logic block has a plurality of first input terminals, each first input terminal connected to the second output terminal of one of the control signal blocks, and an output terminal connected to the control terminal of the driver circuit. The output enable logic block decodes control signals at the first input terminals to generate an enable/disable signal and selectively passes the enable/disable signal to the output terminal at a transition of the clock signal or holds a signal at the output terminal responsive to the stall control signal. The output enable logic blocks operate so that one and only one enable signal is generated at one time.

DETAILED DESCRIPTION OF PREFERRED EMBODIMENTS

Figure 1:
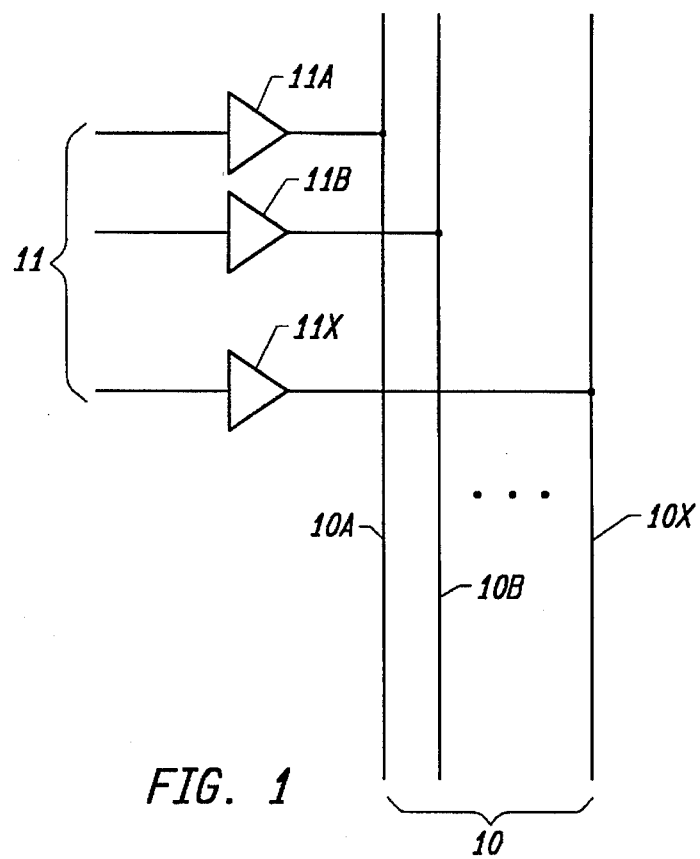
FIG. 1 is a representation of a bus in an integrated circuit with bus drivers at one node of the bus.

FIG. 1 illustrates a bus 10 formed from individual signal lines 10A–10X. At one node of the bus, drivers 11A–11X are respectively connected to each signal line 10A–10X. Each driver pulls the voltage on its respective signal line up or down according to the logic signal at the driver's input terminal.

Figure 2:
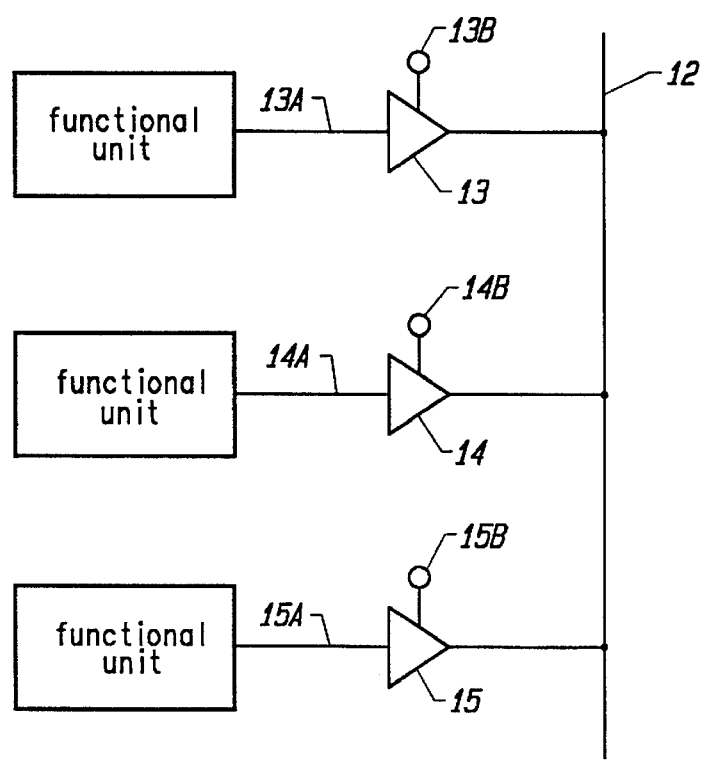
FIG. 2 is a representation of one of the signal lines of a bus in an integrated circuit with bus drivers at different nodes of the bus.

The problem of bus contention is illustrated with a single signal line 12, part of a bus (not shown), in FIG. 2. Drivers 13–15 from different functional units of the integrated circuit are connected at different nodes of the line 12. Bus contention can occur when any two of the drivers 13–15 are on and the logic signals at the input terminals 13A–15A of the drivers 13–15 differ. To avoid this problem, each driver 13–15 has a control terminal 13B–15B respectively. The control terminal allows a signal to turn each driver 13–15 on or off. Hence a driver is said to be capable of three states, logic 1, logic 0, or off.

Figure 3:
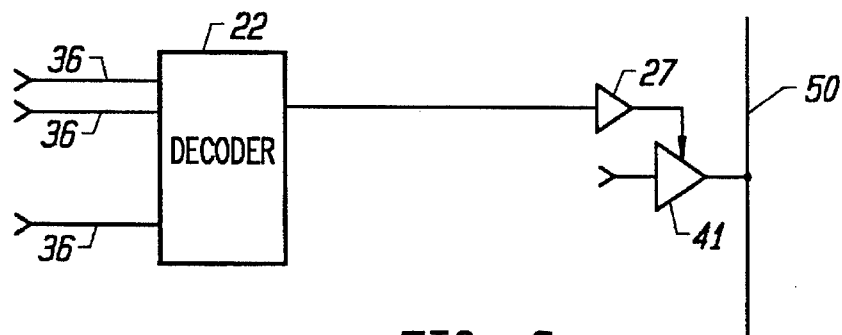
FIG. 3 is a diagram of an idealized control circuit to operate the bus drivers to avoid bus contention.

FIG. 3 illustrates an idealization of output enable control circuitry for each set of drivers at each node of the bus. The control circuitry has a decoder 22 which has a plurality of input terminals which are connected to control signal lines 36 carrying control signals from different functional units of the integrated circuit. The output terminal of the decoder 22 is connected to a buffer 27 which is connected to the enable/disable control terminals of the drivers 41 at a particular node of a bus 50. (Only one driver 41 is shown, for simplicity's sake.). The decoder 22 at each bus node decodes the control signal so one and only one enable signal is generated by one of the decoders 22.

However, a problem with the idealized output control circuitry of FIG. 3 is that the timing of signals at the output of the decoders 22 are inherently imprecise. There are time intervals when the functional "one and only one" rule is broken. There is bus contention. A solution to this timing problem is to place a timing element, such as a flip-flop, at the output terminal of the decoder 22. The output terminal of the flip-flop is connected to the input terminal of the buffer 27. The buffer 27 permits the multiple control terminals of the drivers at one node to be driven better. Sometime after the control signals on the lines 36 are sent to the decoders 22 and settle, a clock signal to the flip-flop holds the output signals of the decoders 22. One and only one of the decoders 22 should enable its drivers.

Nonetheless, there still remains the thorny problem of testing. If the flip-flops at the outputs of the decoders 22 are connected in a serial string for test bits, arbitrary test bits should raise the problem of bus contention again. Thus the problems of operating the bus enable control circuitry to obey the functional rule of avoiding bus contention, timing the bus control circuitry to avoid even momentary bus contention and testing the bus, its drivers and the bus control circuitry appear to be difficult, if not insurmountable.

Figure 4C:
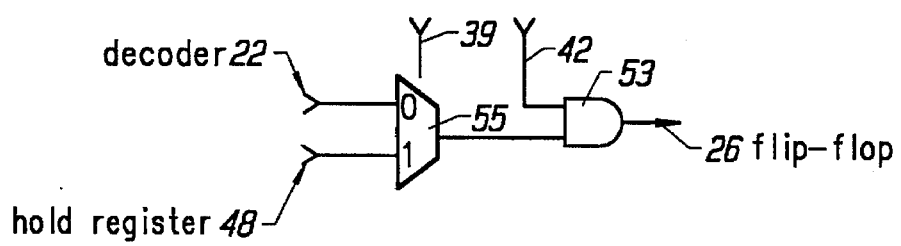
FIG. 4C is alternative circuit for the select-enable block of FIG. 4A.
Figure 4A:
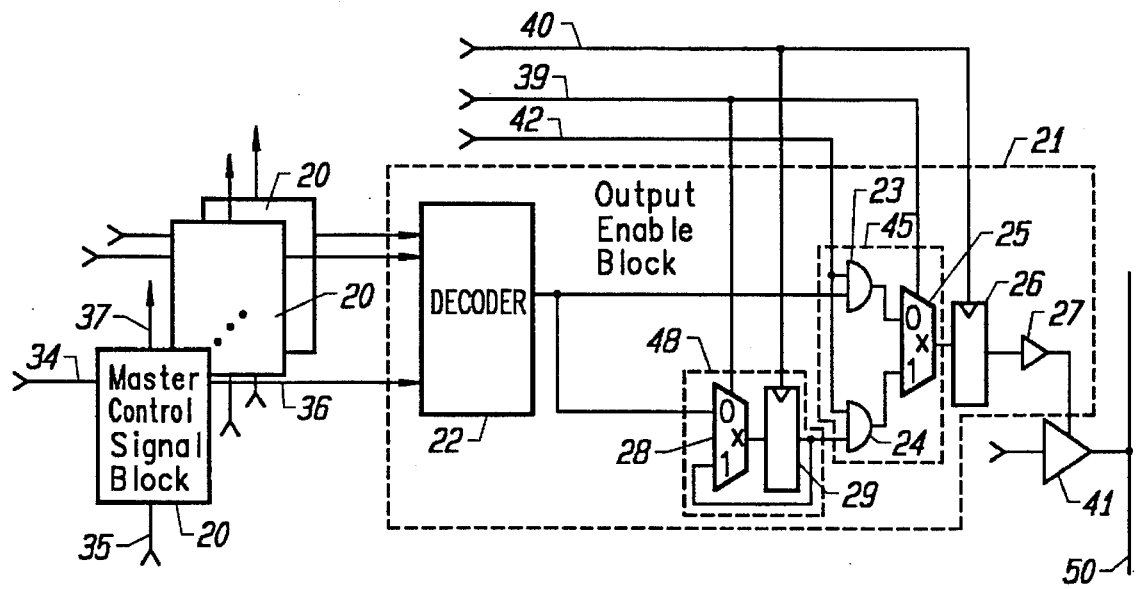
FIG. 4A is a circuit diagram of circuitry to control the bus drivers of a bus according to one embodiment of the present invention.
Figure 4B:
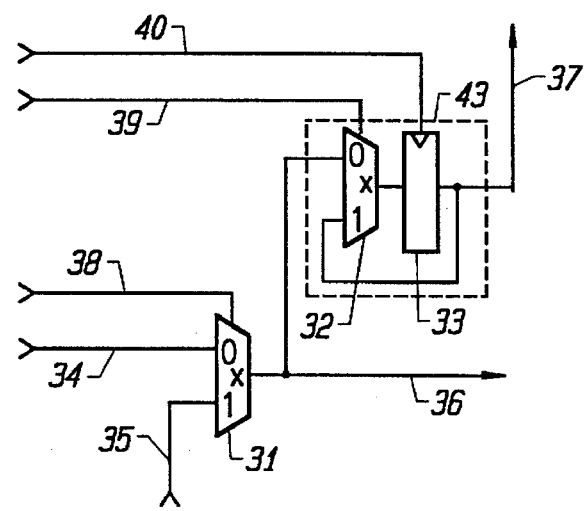
FIG. 4B is a circuit diagram of a portion of the bus control circuitry of FIG. 4A.

The present invention, however, presents a solution to these problems. To permit the testing of the drivers for a bus, the present invention has bus control circuitry, one embodiment of which is shown in FIGS. 4A–4B. The present invention is directed particularly to the testing of a data bus, its bus drivers and control circuitry in a microprocessor. Thus the description below is particular to a microprocessor and functional units typically associated with microprocessors. Nonetheless, an integrated circuit designer should appreciate the applicability of the present invention to integrated circuits in general.

It should be noted that the same references numerals are sometimes carried over from previous drawings to illustrate the similarity of function or operation of the referenced element to help explain the operation and elements of the present invention.

The bus control circuitry has an output terminal connected to the control terminal of a bus driver 41 to enable or disable the driver. The bus control circuitry has an output enable block 21 which controls the drivers 41 at each node of the bus. Only one block 21 is shown in FIG. 4A to represent the connection at one node of the data bus. Each output enable block 21 receives selected control signals from master control signal logic, represented by several master control signal blocks 20.

Each block 20 handles a control signal as described below and is connected to different output enable blocks 21 according to the particular functional block to which the bus drivers are connected. For the serial scanning of test bits, each block 20 has a scan input line 35 and a scan output line 37. The particular connections between the scan input line 35 of one master control signal block 20 and the scan output line 37 of another master control signal block 20 are not shown. It should be evident to integrated circuit designers that these connections may vary and various circuit elements, such as latches and flip-flops, may be inserted between the blocks 20 for various testing implementations.

In accordance with the present invention, the block 20 receives a control signal on a control signal input line 34. The signal to the output enable block 21 is carried from the block 20 on the control signal output line 36. The signal on the line 36 may be a control signal from the control signal input line 34 or a test signal from the scan input line 35.

As shown in FIG. 4B, each master control signal block 20 has a multiplexer 31 which has one input terminal connected to the control signal input line 34 and a second input terminal connected to the scan input line 35. The different control signals for the control signal input line 34 of each block 20 are described below. Selection between the signals on the line 34 and line 35 is controlled by a scan control signal, active high, on a scan control line 38. When the scan signal is high, the signal on the scan input line 35 is selected to appear on the output line 36. If the signal on the control line 38 is low, then the signal on the control signal input line 34 is selected to be passed to the output line 36.

The master control signal logic block 20 also has a hold register 43, formed by a multiplexer 32 and a flip-flop 33, which provide a holding function for bits in the scan path. As long as the signal on an operation control line 39 is high, the register 43 holds the previous bit. When the line 39 goes low, the register holds the next bit from the multiplexer 31 at the rising edge of a clock signal on a clock line 40.

The multiplexer 32 has one input terminal connected to the output line 36 and its own output terminal connected to the input terminal of the flip-flop 33. The output terminal of the flip-flop 33 is connected to the scan output line 37 and is also connected in a feedback path to the second input terminal of the multiplexer 32. The control terminal of the multiplexer 32 is connected to the operation control line 39. When the signal on the line is low, the operations of the microprocessor continue. When the line 39 goes high, operations stop for a stalled condition.

The flip-flop 33 is connected to the clock line 40 so that the flip-flop latches the output signal of the multiplexer 32 at a rising edge of the clock signal on the line 40. Hence, if the signal on the operation control line 39 indicates a stalled condition, the multiplexer 32 selects the feedback input terminal so that the combination of the multiplexer 32 and flip-flop 33 holds the bit at the output terminal of the flip-flop in the previous clock cycle. When the stalled condition is terminated, the signal on line 39 is low and the bit at the output of the multiplexer 31 is then selected by the multiplexer 32. In this manner, signals can be passed along the scan path formed by the scan input lines 35 and scan output lines 37 of the master signal control blocks 20.

The output enable block 21 illustrated in FIG. 4A for each bus node has a decoder 22 which has input terminals connected to the output lines 36 of selected master control signal blocks 20. The decoders 22 of the blocks 21 operate so that one and only one enable/disable signal is generated for the drivers 41 of a node. The output terminal of the decoder 22 is connected to one input terminal of a select-disable block 45 formed by two AND gates 23 and 24 and a multiplexer 25. An alternative circuit for the select-disable block 45 is illustrated in FIG. 4C. A multiplexer 55 and AND gate 53 replaces the multiplexer 25 and two AND gates 23 and 24.

An input terminal of the AND gate 23 is connected to the output terminal of the decoder 22 and is one input terminal of the select-disable block 45. An input terminal of the AND gate 24 is the other input terminal of the select-disable block 45. The AND gate 23 has its output terminal connected to one input terminal of the multiplexer 25. The output terminal of the multiplexer 25 is connected to the input of a flip-flop 26 which has its output terminal, in turn, connected to the buffer 27. The output terminal of the buffer 27 is connected to the control terminal of the bus driver 41.

The output terminal of the decoder 22 is also connected to an input terminal of a hold register 48, formed by a multiplexer 28 and a flip-flop 29. The output terminal of the multiplexer 28 is connected to the input terminal of the flip-flop 29. The output terminal of the flip-flop 29 is connected in a feedback loop to a second input terminal of the multiplexer 28. The control terminal of the multiplexer 28 is connected to the operation line 39 and the clock terminal of the flip-flop 29 is connected to the clock line 40. The output terminal of the flip-flop 29 (and the hold register 48) is connected to one input terminal of the second AND gate 24, the second input terminal of the select-disable block 45. The AND gates 23 and 24 each have a second input terminal connected to a special control signal line 42. The signal, active low, on the line 42 disables all the drivers 41 and permits a special functional block, such as a bus interface unit, to take controlof the bus. The drivers for the special functional block are enabled only when the signal on the line 42 is active. This permits the special functional block immediate access to the bus, while permitting the serial scan testing of the bus, its drivers and control circuitry without bus contention.

Operationally, the hold register 48, i.e., the multiplexer 28 and the flip-flop 29, holds the bit from the decoder 22 when a stall condition on the control line 39 occurs. While the stall condition continues, the bit from the decoder 22 in the clock cycle when the stall occurred remains at the control terminal of the driver 41. Otherwise and assuming that no active control signal appears on the line 42, the enable/disable signal from the decoder 22 appears on the control terminal of the driver 41 at the rising edge of the clock signal on the line 40.

The timing of the output enable blocks 21 is such that the decoded enable/disable signal is available to the driver 41 at the rising edge of each clock signal at the line 40. This permits precise timing to avoid bus contention at high speed operation.

Figure 5:
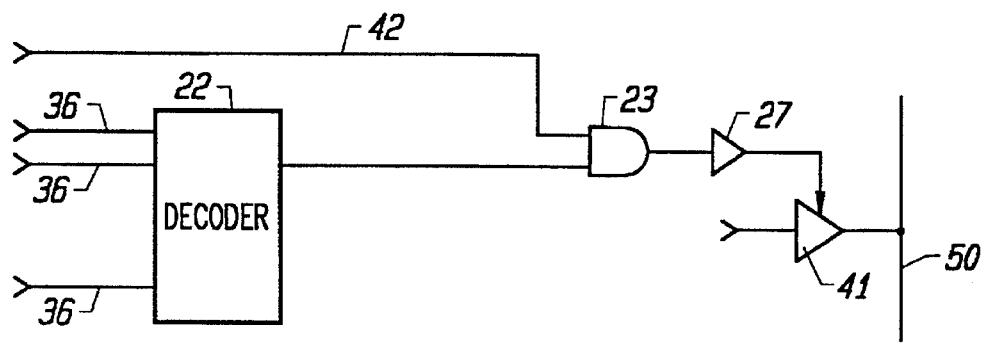
FIG. 5 is a diagram of an equivalent circuit of a portion of the circuit of FIG. 4A and 4B.

In accordance with the present invention, the control signal line 42 has primacy over the other control signals received by the decoders 22. When the signal line 42 is low, the signals from the AND gates 23 and 24 are low. The drivers connected to the control circuitry shown in FIG. 4A are disabled. This allows a functional unit to be granted immediate access to the bus upon assertion, active low, of a signal on the line 42. It should be noted that the output enable block 21 appears as the equivalent circuit illustrated in FIG. 5 for testing with an automatic test pattern generator. The flip-flops and multiplexers are removed; only the decoder and AND gate 23 remain and the inputs 36 are driven by the master control signals 37.

In the specific embodiment of the present invention, the decoders 22 are defined by the following equations in VHDL for a microprocessor. Decoders operate so that one and only one decoder is enabled at a time. The integrated circuit has a central processing unit, co-processors such as a memory management unit, cache memory and on-chip read-only memory, which access the data bus:

decode0=mem_fetch* & cop_drive*
decode1=mem_fetch* & cop_drive & copp[1]* & copp[0]*
decode2=mem_fetch* & cop_drive & copp[1]* & copp[0]
decode3=mem_fetch* & cop_drive & copp[1]& copp[0]*
decode4=mem_fetch* & cop_drive & copp[1]& copp[0]
decode5=mem_fetch & on_chip
decode6=mem_fetch & on_chip* where the control signals are defined as:

| | |
|---|---|
| mem_fetch | Read data from cache memory or main memory when signal is high. |
| cop_drive | A coprocessor unit will drive the data bus; signal is active high. |
| copp[1:0] | Coprocessor number; signals active high; combinations identify one of four coprocessor units. |
| on_chip | Read data from on-chip memory (not cache) when signal is high. |

The symbol "&" represents the AND logic function; "*" represents a negation, or NOT, of the preceding control signal. Other control signals include:

| | |
|---|---|
| signal42 | Active low control signal on line 42 for a bus interface unit to take over the data bus; other functional units to get off data bus. |

Decode0 gives control of the bus to the CPU. No memory access is requested nor does a coprocessor unit want the bus. Decode1–decode4 gives bus control to one of the coprocessor units. In this instance, no memory access is requested, but the cop_drive indicates that a coprocessor unit is requesting control of the bus. The copp[1] and copp[0] signals identify the coprocessor unit. Decode5 and decode6 are indicative of a memory fetch operation over the data bus. In the case of decode5, a memory fetch operation from the on-chip memory is indicated. In the case of decode6, a memory fetch operation from cache memory or main memory is indicated.

Signal42 is not sent to the decoders 22. Rather, as explained above, signal42, though an AND gate, grants immediate control of the data bus, to the functional unit asserting the signal. Assertion of signal42 disables the drivers 41 to the bus.

Thus, in this manner one and only one of the functional units of a microprocessor obtain access to the data bus at a time.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. In an integrated circuit device having a bus, said bus having a plurality of signal lines, each signal line connected to a plurality of driver circuits for driving digital signals onto said signal line, each driver circuit having a control terminal for enabling and disabling said driver circuit responsive to signals at said control terminal, control circuitry for said driver circuits comprising a plurality of master control signal logic blocks, each block having a first input terminal receiving a scan signal, a second input terminal receiving a control signal from a remainder of the integrated circuit, a first output terminal connected in a scan chain and a second output terminal, said control signal logic block selectively passing said scan signal or said control signal to said second output terminal responsive to a scan control signal, and selectively passing said signal at said second output terminal to said first output terminal at a clock signal or holding a signal at said second output terminal responsive to a stall control signal; and an output enable logic block for each driver circuit, each output enable block having a plurality of first input terminals, each first input terminal connected to said second output terminal of one of said control signal blocks, and an output terminal connected to said control terminal of said driver circuit, said output enable logic block decoding control signals at said first input terminals to generate an enable/disable signal and selectively passing said enable/disable signal to said output terminal or holding a signal at said output terminal responsive to said clock signal and to said stall control signal.

2. The control circuitry of claim 1 wherein said output enable logic block for each driver circuit decodes said driver control signals such that one and only one enable signal is generated at a time.

3. The control circuitry of claim 1 wherein said stall control signal stalls operations of said integrated circuit.

4. The control circuitry of claim 1 wherein said control signal logic blocks and said output enable blocks operate to selectively pass or hold a signal at a transition of said clock signal.

5. In an integrated circuit device having a bus, said bus having a plurality of signal lines, each signal line connected to a plurality of driver circuits for driving digital signals onto said signal line, each driver circuit having a control terminal for enabling and disabling said buffer circuit responsive to signals at said control terminal, control circuitry for each driver circuit comprising: master control signal logic comprising:

a first multiplexer having an output terminal, a first input terminal receiving a scan signal and a second input terminal receiving an output enable signal, said first multiplexer passing a received signal to said output terminal responsive to a scan enable signal;

a first hold register having an output terminal sending a scan signal and an input terminal connected to said output terminal of said first multiplexer, said first hold register passing a received signal to its said output terminal responsive to a clock signal and holding said received signal responsive to an operation signal; and output enable logic comprising:

a decoder having an output terminal and a plurality of input terminals, one of the plurality of input terminals being connected to said output terminal of said first multiplexer;

a second hold register having an output terminal and an input terminal, said input terminal connected to said output terminal of said decoder, said second hold register passing a received signal to its said output terminal responsive to a clock signal and holding said received signal responsive to said operation signal;

a select-enable block having an output terminal, a first input terminal connected to said decoder output terminal, and a second input terminal connected to said second hold register output terminal, said select-enable block selectively passing a signal from said first or second input terminal to said output terminal responsive to said operation signal and generating a disable signal responsive to a special control signal; and a first flip-flop having an input terminal connected to said output terminal of said select-enable block and an output terminal connected to said driver circuit control terminal, said first flip-flop passing a signal at said input terminal to said output terminal responsive to said clock signal.

6. The control circuitry of claim 5 further comprising a buffer connected between said output terminal of said first flip-flop and said control terminal.

* * * * *